US012660713B2

(12) United States Patent
Kim et al.

(10) Patent No.: US 12,660,713 B2
(45) Date of Patent: Jun. 16, 2026

(54) SEMICONDUCTOR DEVICES INCLUDING BONDED SEMICONDUCTOR LAYERS AND MANUFACTURING METHODS OF THE SAME

(71) Applicant: SAMSUNG ELECTRONICS CO., LTD., Suwon-si (KR)

(72) Inventors: Byeongchan Kim, Suwon-si (KR); Un-Byoung Kang, Suwon-si (KR); Jumyong Park, Suwon-si (KR); Dongjoon Oh, Suwon-si (KR); Jun Young Oh, Suwon-si (KR); Jeongil Lee, Suwon-si (KR); Chungsun Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 374 days.

(21) Appl. No.: 18/356,035

(22) Filed: Jul. 20, 2023

(65) Prior Publication Data

US 2024/0178202 A1     May 30, 2024

(30) Foreign Application Priority Data

Nov. 24, 2022     (KR) ........................ 10-2022-0159501

(51) Int. Cl.
H01L 23/02 (2006.01)
H10W 70/685 (2026.01)
(Continued)

(52) U.S. Cl.
CPC ......... H10W 90/00 (2026.01); H10W 70/685 (2026.01); H10B 80/00 (2023.02);
(Continued)

(58) Field of Classification Search
CPC . H01L 25/105; H01L 23/49822; H01L 24/08; H01L 24/09; H01L 24/80; H01L 2224/0224; H01L 2224/08148; H01L 2224/0903; H01L 2224/80895; H01L 2224/80896; H01L 2225/1023; H01L 2924/1431; H01L 2924/1432; H01L 2924/2075; H01L 24/06; H01L 2924/014; H01L 2224/0401; H01L 2924/15311; H01L 25/0657; H01L 2224/04042; H01L 24/73;
(Continued)

(56) References Cited

U.S. PATENT DOCUMENTS 8,710,607 B2     4/2014   Chen et al.
8,816,491 B2     8/2014   Chen et al.
(Continued)

*Primary Examiner* — Niki H Nguyen
(74) *Attorney, Agent, or Firm* — Wolf, Greenfield & Sacks, P.C.

(57)     ABSTRACT

A semiconductor device includes: a semiconductor layer including a wire and an electrical element; and a plurality of metal pads on a surface of the semiconductor layer, wherein the plurality of metal pads includes a first metal pad and a second metal pad, wherein the second metal pad is smaller in surface area or diameter on the surface of the semiconductor layer than the first metal pad, and wherein the second metal pad is between a first region of the surface of the semiconductor layer where the first metal pad is and a second region of the surface of the semiconductor layer where a surface metal density is zero (0).

20 Claims, 12 Drawing Sheets

(51) Int. Cl.

| | |
|---|---|
| *H10W 90/00* | (2026.01) |
| *H10B 80/00* | (2023.01) |
| *H10W 70/60* | (2026.01) |
| *H10W 72/90* | (2026.01) |
| *H10W 80/00* | (2026.01) |

(52) U.S. Cl.

CPC .......... *H10W 70/60* (2026.01); *H10W 72/926* (2026.01); *H10W 72/985* (2026.01); *H10W 80/312* (2026.01); *H10W 80/327* (2026.01); *H10W 80/721* (2026.01); *H10W 90/792* (2026.01); *H10W 90/794* (2026.01)

(58) Field of Classification Search

CPC ... H01L 2224/48247; H01L 2224/0603; H01L 2224/08145; H01L 25/18; H01L 2224/023; H01L 2224/32145; H01L 2224/04105; H01L 24/82; H01L 2224/12105; H01L 2225/1058; H01L 23/5385; H01L 2224/16145; H01L 24/12; H01L 2224/09517; H01L 2225/06517; H01L 23/3121; H01L 2224/05548; H01L 2224/05; H01L 2225/06513; H01L 2224/06517; H01L 2224/06131; H01L 23/5389; H01L 2224/13006; H01L 2224/13022; H01L 2924/18161; H01L 2224/05008; H01L 23/5383; H01L 2225/06506; H01L 24/17; H01L 25/0655; H01L 2224/81801; H01L 2224/85205; H01L 2224/08146; H01L 2224/0231; H01L 2224/08058; H01L 23/488; H01L 2225/06586; H01L 21/563; H01L 2224/0558; H01L 2224/09051; H01L 25/0652; H01L 25/0753; H01L 2224/16148; H01L 2224/16235; H10B 80/00

See application file for complete search history.

(56) References Cited

U.S. PATENT DOCUMENTS

| | | | |
|---|---|---|---|
| 9,640,243 | B2 | 5/2017 | Shibata et al. |
| 10,236,238 | B2 | 3/2019 | Fujii et al. |
| 10,978,505 | B2 | 4/2021 | Sato et al. |
| 11,018,104 | B2 | 5/2021 | Chen et al. |
| 11,049,776 | B2 | 6/2021 | Jung |
| 11,335,656 | B2 | 5/2022 | Hu et al. |
| 11,424,205 | B2 | 8/2022 | Chen et al. |
| 2017/0062383 | A1* | 3/2017 | Yee ..................... H01L 25/0652 |
| 2022/0028804 | A1 | 1/2022 | Mitsuhashi et al. |
| 2022/0077116 | A1* | 3/2022 | Park .................. H01L 23/49838 |

* cited by examiner

Pad Diameter decreasing (Scribe Line)

Pad Diameter increasing (Align Key)

Scribe line, align key
surrounding region

Keep out zone
surrounding region

SEMICONDUCTOR DEVICES INCLUDING BONDED SEMICONDUCTOR LAYERS AND MANUFACTURING METHODS OF THE SAME

CROSS-REFERENCE TO RELATED APPLICATION

This application claims priority to and the benefit of Korean Patent Application No. 10-2022-0159501 filed in the Korean Intellectual Property Office on Nov. 24, 2022, the entire contents of which are incorporated herein by reference.

BACKGROUND

The present disclosure relates to semiconductor devices including bonded semiconductor layers and manufacturing methods of the same.

Hybrid bonding may be a permanent bonding that directly bonds at least two semiconductor layers (e.g., semiconductor wafers or semiconductor chips), each of which includes a dielectric material, such as oxide, and a metal wire (line), such as copper wire, and an electrical element embedded therein to form an interconnection of the metal lines and integrate those semiconductor layers. Hybrid bonding may also be referred to as Direct Bond Interconnect (DBI). For example, hybrid bonding may enable semiconductor layers to be directly connected face-to-face through a bonding of embedded metal pads along with a fusion of dielectric materials at a bonding interface between the semiconductor layers.

A hybrid bonding process requires a high degree of precision, and when a void is formed between two semiconductor layers (e.g., semiconductor wafers or semiconductor chips) to be bonded because of an insufficient degree of precision in the process, a connection failure between metal pads may occur.

SUMMARY

An embodiment to reduce the possibility of the occurrence (e.g., to prevent) of air gaps (e.g., voids) between two semiconductor layers to be bonded in the hybrid bonding may be provided.

An embodiment for improving a reliability of a semiconductor layer bonding may be provided.

A semiconductor device according to an embodiment includes: a semiconductor layer including a wire and an electrical element; and a plurality of metal pads on a surface of the semiconductor layer, wherein the plurality of metal pads includes a first metal pad and a second metal pad, wherein the second metal pad is smaller in surface area or diameter on the surface of the semiconductor layer than the first metal pad, and wherein the second metal pad is between a first region of the surface of the semiconductor layer where the first metal pad is and a second region of the surface of the semiconductor layer where a surface metal density is zero (0).

A manufacturing method of a semiconductor device according to an embodiment includes: preparing a first semiconductor layer including a wire and an electrical element, wherein a plurality of metal pads is on a surface of the first semiconductor layer; and stacking and bonding a second semiconductor layer on the surface of the first semiconductor layer, wherein the plurality of metal pads includes a first metal pad and a second metal pad, wherein the second metal pad is smaller in surface area or diameter on the surface of the first semiconductor layer than the first metal pad, and wherein the second metal pad is between a first region of the surface of the first semiconductor layer where the first metal pad is and a second region of the surface of the first semiconductor layer where a surface metal density is zero (0).

A semiconductor device according to an embodiment includes: a silicon interposer; a memory that includes a plurality of semiconductor chip dies stacked on the silicon interposer; and a logic circuit on the silicon interposer, wherein the logic circuit includes a central processing unit or a graphics processing unit, wherein at least one of the silicon interposer, the plurality of semiconductor chip dies, and the logic circuit includes a plurality of metal pads on a surface thereof, wherein the plurality of metal pads includes a first metal pad and a second metal pad, wherein the second metal pad is smaller in surface area or diameter on the surface than the first metal pad, and wherein the second metal pad is between a first region of the surface where the first metal pad is and a second region of the surface where a surface metal density is zero (0).

The semiconductor device according to an embodiment may not include a void at an interface between two bonded semiconductor layers.

In addition, the semiconductor device according to an embodiment may have excellent bonding reliability.

DETAILED DESCRIPTION OF THE EMBODIMENTS

Figure 1:
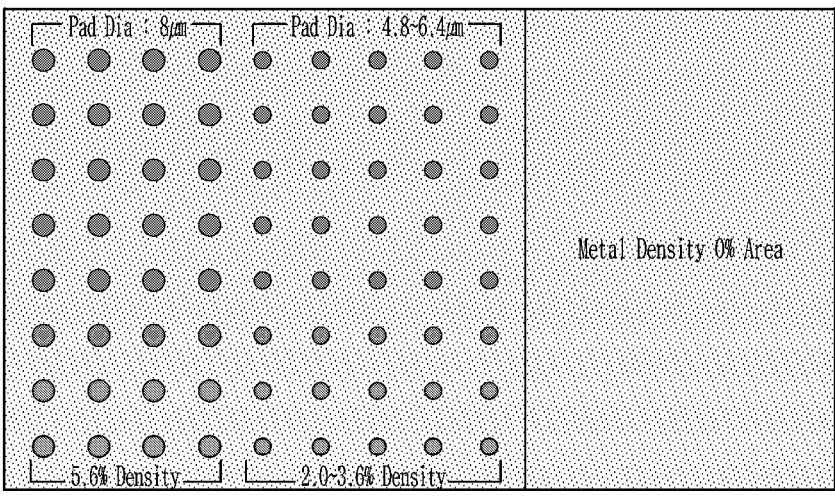
FIG. 1 is a plan view of a metal pad layout of a bonding surface of a semiconductor layer according to an embodiment.

The present invention will be described more fully hereinafter with reference to the accompanying drawings, in which embodiments of the invention are shown. While the embodiments of the invention have been particularly shown and described, it will be understood by one of ordinary skill in the art that variations in from and detail may be made therein without departing from the scope of the present invention. It should also be noted that in some alternate implementations, the steps of the method of manufacturing or the steps of operations herein may occur out of order. For example, two steps described in succession may in fact be executed substantially concurrently or the steps may sometimes be executed in the reverse order. Moreover, the steps of the method or operation may be separated into multiple steps and/or may be at least partially integrated. Finally, other steps may be added/inserted between the steps that are illustrated, and/or the steps may be omitted without departing from the scope of the present invention.

The drawings and descriptions are to be regarded as illustrative in nature and not restrictive. Throughout the specification, same reference numerals refer to same elements unless the context clearly indicates otherwise.

Further, the size and thickness of each configuration shown in the drawings are illustrated for better understanding and ease of description, and the present invention is not limited to such drawings. In the drawings, the thickness of a layer, film, plate, region, etc. may be exaggerated for clarity. In the drawings, the thickness of some layers and regions may be exaggerated for better understanding and ease of description.

The singular forms "a," "an," and "the" used in this specification are intended to include the plural forms as well, unless the context clearly dictates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

In the specification and the range of claims, a term "and/or" is intended to include any combination of terms "and" and "or" for a meaning and an interpretation thereof. For example, "A and/or B" may be understood to mean "A, B, or A and B". Moreover, the symbol "/" will be understood to be equivalent to the term "and/or."

The phrase "at least one of -" in the specification and claims is intended to include the meaning of "at least one selected from the group of -" for its meaning and interpretation. For example, "at least one of A and B" may be understood to mean "A, B, or A and B".

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of embodiments.

When an element such as a layer, film, region or substrate is referred to as being "on" another element, it may be directly on the other element or an intermediate element may also exist. In contrast, when an element is referred to as being "directly on" another element, there are no intermediate elements present. In addition, the term 'above' of the target element throughout the specification should be understood as positioning above or below the target element, and does not necessarily mean positioning 'above' with the opposite direction of gravity as a reference.

For example, spatially relative terms such as "below" and "above" may be used to easily describe the relationship between one element or constituent element and another constituent element as shown in a drawing. The spatially relative terms are intended to include other directions in the device in a use or operation in addition to the directions shown in the drawing. For example, if the device shown in the drawing is turned over, a device positioned 'below' another device may be positioned 'above' the other device. Thus, the exemplary term "below" may include both lower and upper positions. The devices may also be oriented in different directions, so the spatially relative terms may be interpreted differently depending on the direction.

When an element (or a region, a layer, a portion, etc.) is referred to in the specification as being "connected" or "coupled" to another element, it either directly disposed, connected, or coupled to the other element mentioned above, or an intervening element between them may be disposed.

The terms "connected to" or "coupled to" may include physical or electrical connections or couplings.

Unless otherwise defined, all terms (including technical and scientific terms) used herein have the same meaning as commonly understood by one of ordinary skill in the art to which the present disclosure belongs. It is further to be understood that, the terms such as those defined in commonly used dictionaries are to be interpreted as having meanings that are consistent with the meanings in the context of the related art, and are not to be interpreted in an idealized or extremely formalized sense, unless expressively so defined herein.

Figure 2:
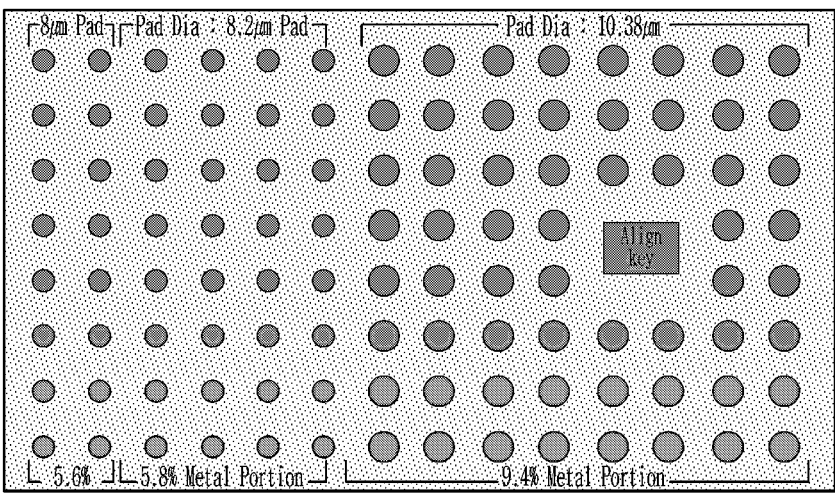
FIG. 2 is a plan view of a metal pad layout of a bonding surface of a semiconductor layer according to an embodiment.

FIG. 1 and FIG. 2 are plan views of metal pad layouts of a bonding surface of a semiconductor layer according to embodiments.

In order to form a semiconductor device by bonding (e.g., hybrid bonding) semiconductor layers (e.g., semiconductor wafers or semiconductor chips), a dielectric material portion and a plurality of metal pads exposed on bonded surfaces of each of the semiconductor layers must be precisely aligned.

Referring to FIG. 1 and FIG. 2, the size (e.g., diameter) of the plurality of metal pads exposed on the bonded surfaces of each of the semiconductor layers may be different depending on their positions within the bonded surfaces. The size of the plurality of metal pads exposed on the bonded surfaces of the semiconductor layers may be larger when a metal pad among the plurality of metal pads is disposed adjacent to a higher metal density area and smaller when the metal pad is disposed adjacent to a lower metal density area.

Referring to FIG. 1, when a diameter of a base metal pad is, for example, 8 micrometers ($\mu$m), a region where a metal pad with a diameter of less than 8 $\mu$m (intermediate metal pad), for example, 4.8 $\mu$m to 6.4 $\mu$m, is arranged, may be disposed between a region where no metal pad is formed (a region with 0% metal density) and a region where a diameter of a metal pad is 8 $\mu$m. In this way, the metal density of the region, including the metal pad with a diameter of 8 $\mu$m may be about 5.6%, and the metal density of the region, including the metal pad with a diameter of 4.8 $\mu$m to 6.4 $\mu$m may be about 2.0% to 3.6%. In this way, if the region with the lower metal density of about 2.0% to 3.6% is disposed between the region with the higher metal density of about 5.6% and the region with the metal density of 0%, the topology of the bonded surfaces of the semiconductor layers may be avoided from a drastic change. Through this, when forming a stack by bonding the semiconductor layers, it is possible to reduce the possibility of the occurrence of (e.g., to prevent) voids on the bonded surfaces. The diameter of 8 μm of the base metal pad and the diameter of 4.8 μm to 6.4 μm of the intermediate metal pad provided above are only examples, and the embodiments of the diameters of these metal pads are not limited thereto.

The plurality of metal pads may include real metal pads connected to electrical elements and/or wires in the semiconductor layer through, for example, vias, and/or dummy metal pads formed to control the metal density without a (electrical) connection to electrical elements or wires in the semiconductor layer.

Referring to FIG. 2, when the diameter of the base metal pad is 8 μm, a metal pad with a larger diameter, for example, about 10.38 μm, may be disposed around (adjacent to) the region where an align key is positioned, and a metal pad with an intermediate diameter, for example, about 8.2 μm, may be disposed between the metal pad with the diameter of 8 μm and the metal pad with the diameter of 10.38 μm. In this way, the metal density of the region with the metal pad of the diameter of 8 μm may be about 5.6%, the metal density of the region with the metal pad of the diameter of about 8.2 μm may be about 5.8%, and the metal density of the region with the metal pad of the diameter of about 10.38 μm may be about 9.4%. As such, if the region with the intermediate metal density of about 5.8% is disposed between the region with the lower metal density of about 5.6% and the region with the higher metal density of about 9.4%, the topology of the bonded surfaces of the semiconductor layers may be avoided from a drastic change. Through this, when forming a stack (semiconductor device) by bonding the semiconductor layers, it is possible to reduce the possibility of the occurrence of (e.g., to prevent) voids on the bonded surfaces.

The diameter of 8 μm of the base metal pad, the diameter of 8.2 μm of the intermediate metal pad, and the diameter of 10.38 μm of the larger metal pad provided above are only examples, and the embodiments of the diameters of these metal pads are not limited thereto.

The plurality of metal pads may include real metal pads connected to electrical elements and/or wires in the semiconductor layer through, for example, vias, and/or dummy metal pads formed to control the metal density of the surface of the semiconductor layer without a (electrical) connection to electrical elements or wires in the semiconductor layer.

Figure 3A:
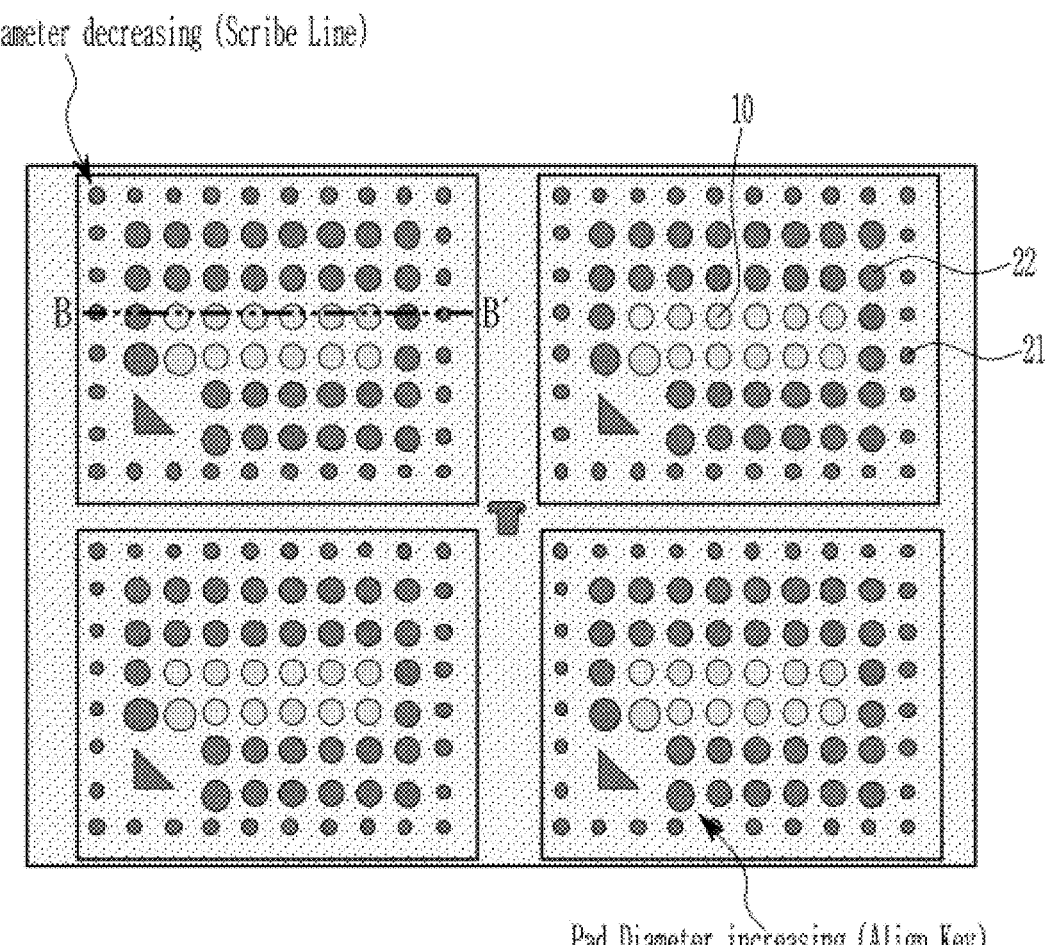
FIG. 3A is a plan view of a metal pad layout of a bonding surface of a semiconductor layer according to an embodiment.
Figure 3B:
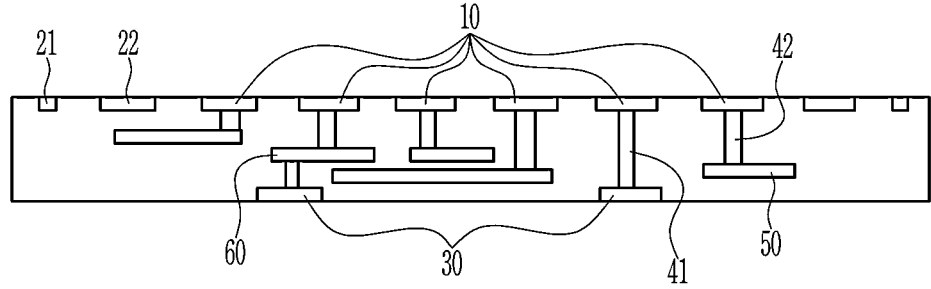
FIG. 3B is a cross-sectional view taken along a line B-B' of FIG. 3A.

FIG. 3A is a plan view of a metal pad layout of a bonding surface of a semiconductor layer according to an embodiment. FIG. 3B is a cross-sectional view taken along a line B-B' of FIG. 3A.

Referring to FIG. 3A, a plurality of chip regions may be partitioned on a surface (e.g., bonded surface) of a semiconductor layer, and a plurality of real metal pads 10 may be arranged in the center area of each chip region, and an (e.g., triangular) align key and a plurality of first dummy metal pads 21 and a plurality of second dummy metal pads 22 may be arranged adjacent to (e.g., around) the plurality of real metal pads 10. The size of the plurality of real metal pads 10 may be uniform (e.g., constant), the plurality of second dummy metal pads 22 may have the same size (e.g., diameter) as or similar (substantially the same) size to the size of the plurality of real metal pads 10, and the plurality of first dummy metal pads 21 may have a smaller size (e.g., diameter) than the plurality of second dummy metal pads 22. The sizes of metal pads may refer to areas or diameters of upper surfaces (surface of metal pads exposed from a bonding surface) of the metal pads. The plurality of second dummy metal pads 22 may be adjacent to the plurality of real metal pads 10 in the center area. The plurality of second dummy metal pads 22 may be disposed to surround the plurality of real metal pads 10. The plurality of first dummy metal pads 21 may be disposed adjacent to (along) an edge of the chip region. The plurality of first dummy metal pads 21 may be disposed to surround the plurality of second dummy metal pads 22 and/or the align key.

Referring to FIG. 3B, the plurality of real metal pads 10, the plurality of first dummy metal pads 21, and the plurality of second dummy metal pads 22 may be positioned at a same distance (as one layer) from a lower surface of the semiconductor layer. For example, the plurality of real metal pads 10, the plurality of first dummy metal pads 21, and the plurality of second dummy metal pads 22 may be disposed on (exposed from) an upper surface of the semiconductor layer. Among them, the plurality of first dummy metal pads 21 and the plurality of second dummy metal pads 22 may float without being connected to other elements, and the plurality of real metal pads 10 may be connected to a wire 50 and/or an (electrical) element 60 in the semiconductor layer through vias 41 and 42. Rear pads 30 for connection to an external circuit may also be disposed on the lower surface of the semiconductor layer opposite to the upper surface from which the plurality of real metal pads 10, the plurality of first dummy metal pads 21, and the plurality of second dummy metal pads 22 may be exposed.

As described above, by disposing the plurality of first dummy metal pads 21 and the plurality of second dummy metal pads 22 around the plurality of real metal pads 10 and changing the sizes or diameters of upper surface areas of the plurality of first dummy metal pads 21 and the plurality of second dummy metal pads 22, it is possible to buffer the change in the metal density around the plurality of real metal pads 10. Through this, it is possible to avoid the topology of the bonded surface of the semiconductor layer from a drastic change. Through this, when forming the semiconductor device (e.g., stack) by bonding the semiconductor layers, it is possible to reduce the possibility of the occurrence of (e.g., to prevent) voids on the bonded surface.

In the above, the case where the sizes of the plurality of first dummy metal pads 21 and the plurality of second dummy metal pads 22 are different has been provided as an example, but the change in the metal density of the semiconductor layer surface may be controlled by changing the size (the diameter) of the plurality of real metal pads 10 instead of the plurality of first dummy metal pads 21 and the plurality of second dummy metal pads 22. In addition, the plan views of the plurality of first dummy metal pads 21, the plurality of second dummy metal pads 22, and the plurality of real metal pads 10 are shown as circles but may be formed in shapes other than circles, such as ellipses or polygons, for example.

Figure 4:
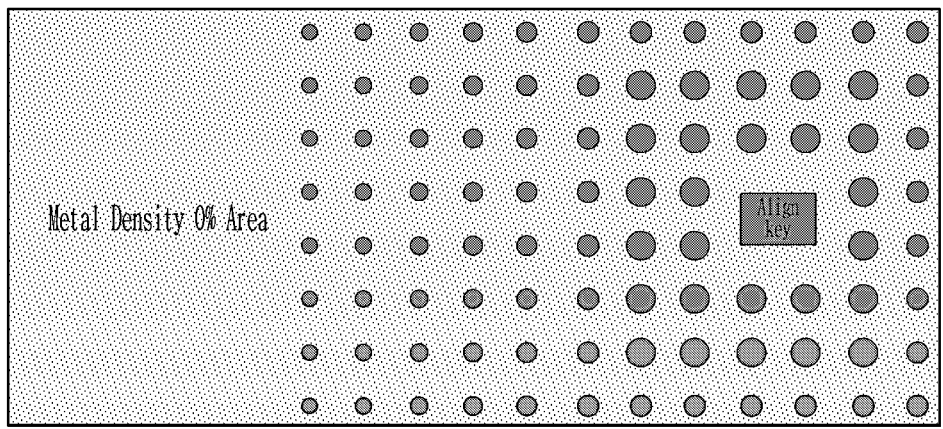
FIG. 4 is a plan view of a metal pad layout of a bonding surface of a semiconductor layer according to an embodiment.

FIG. 4 is a plan view of a metal pad layout of a bonding surface of a semiconductor layer according to an embodiment.

Referring to FIG. 4, the sizes (e.g., diameters) of the metal pads may be gradually decreased from the area around the align key with higher metal density toward the region with zero (0) metal density. In areas where space is limited, it may be difficult to gradually reduce the size of metal pads due to the limited space. In these cases, intermediate metal pads with one uniform intermediate size may be disposed between the higher metal density region and the zero metal density region. In areas where there is more space available, intermediate metal pads with multiple intermediate sizes, which may be gradually reducing from the higher metal density region toward the zero metal density region, may be disposed.

In the above, when the semiconductor device (e.g., stack) is formed by bonding the semiconductor layers, in order to improve the topology of the bonded surfaces of the semiconductor layers to reduce the possibility of the occurrence of voids on the bonded surfaces, the diameter of the intermediate (e.g., medium) size of the intermediate metal pads may be formed to be 59.625% to 80.25% of the diameter of the base metal pad, but is not limited thereto. For example, if the diameter of the base metal pad is 8 μm, the diameter of the intermediate metal pads may be 4.8 μm to 6.4 μm.

The size of the intermediate metal pads may be calculated as follows.

First, a permissible topology change rate of a topology of the bonded surface of the semiconductor layer that can reduce (e.g., prevent) the occurrence of voids may be expressed by Equation 1 below.

$$\text{Permissible Topology Change Rate } [\%/\mu m] = (\text{Topology Change Reference } [\text{Å}/\mu m])/(\text{Relation between Metal Pad Density and Bonded Surface Erosion Depth } [\text{Å}/\%]) \qquad \text{[Equation 1]}$$

Alternatively, the permissible topology change rate may be described by Equation 2 below.

$$\text{Permissible Topology Change Rate } [\%/\text{pitch}] = \{(\text{Topology Change Reference}[\text{Å}/\mu m])/(\text{Relation between Metal Pad Density and Bonded Surface Erosion Depth } [\text{Å}/\%])\}^*\text{Metal Pad Pitch } [\mu m] \qquad \text{[Equation 2]}$$

The metal pad pitch may be a minimum distance between centers of two directly adjacent metal pads.

Figure 5:
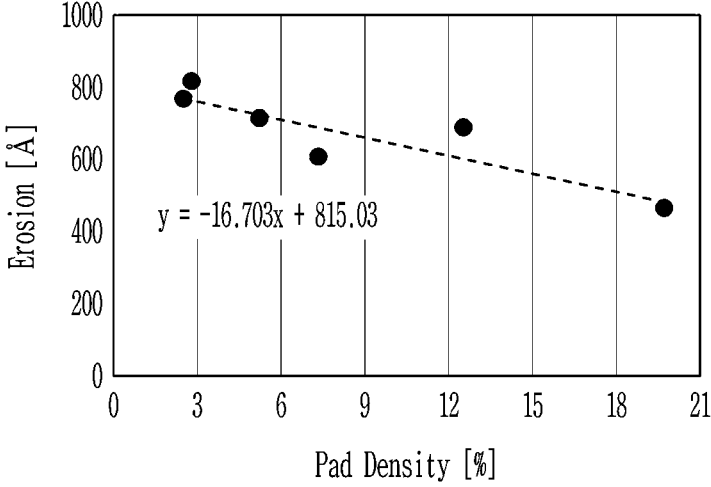
FIG. 5 is a graph of a change in erosion depth of a semiconductor layer depending on metal pad density.

The change in an erosion depth of the bonded surface depending on the metal pad density (Relation between Metal Pad Density and Bonded Surface Erosion Depth) may be represented by the graph in FIG. 5. FIG. 5 is a graph of a change in erosion depth of a semiconductor layer depending on metal pad density, which may be represented by a straight line with an approximate slope of 16.703 Å/%, but is not limited thereto.

For example, if the topology change reference of the bonded surface of the semiconductor layer is 50 Å/100 μm and the metal pad pitch is 30 μm, the permissible topology change rate is (0.5/16.7)*30%/pitch=3.6%/4 pitch.

Figure 6:
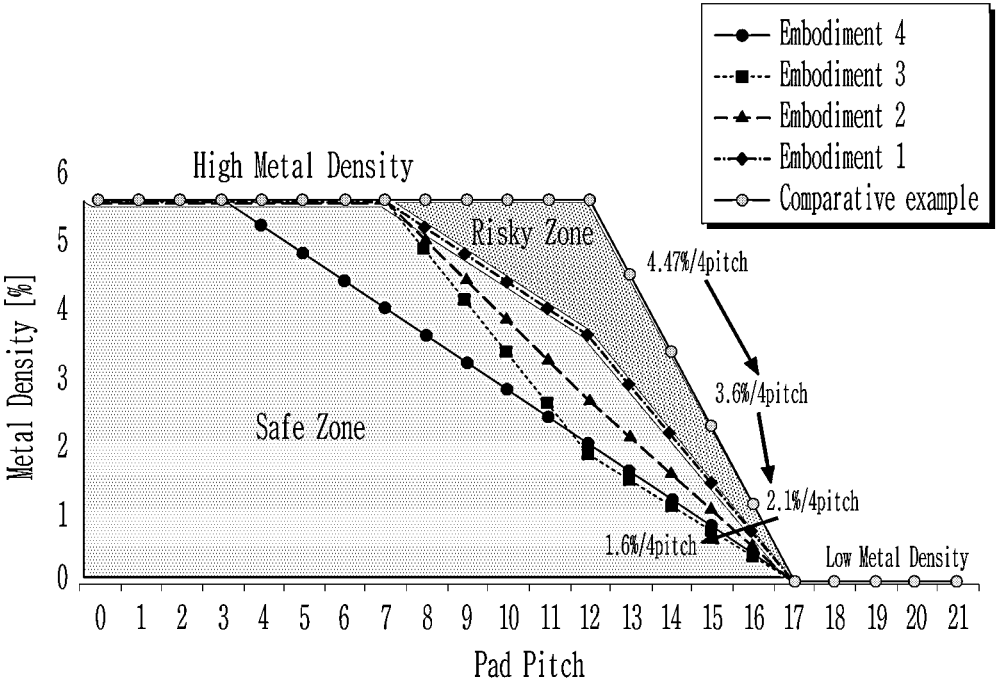
FIG. 6 shows metal density of a bonding surface of a semiconductor layer depending on metal pad pitch according to embodiments with various metal pad density change rates.

FIG. 6 shows metal density of a bonding surface of a semiconductor layer depending on metal pad pitch according to embodiments with various metal pad density change rates. Here, the metal pad density is calculated as the area of the metal pad (e.g., copper metal pad) compared to a reference area (e.g., a ratio of the area of the metal pad within 4 pitch×4 pitch).

In FIG. 6, Embodiment 1 is a graph for 3.6%/4 pitch, and Comparative example is a graph for 4.47%/4 pitch. All graphs positioned below Embodiment 1 may be in the permissible topology change rate range.

Figure 7:
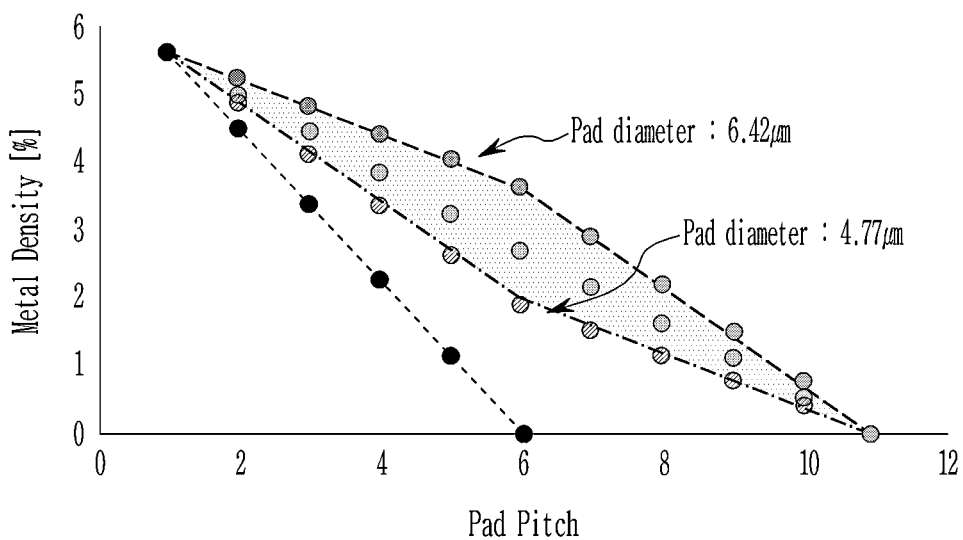
FIG. 7 provides graphs showing permissible limit values of intermediate metal pad diameters to satisfy metal pad density change rate according to embodiments.

FIG. 7 provides graphs showing permissible limit values of intermediate metal pad diameters to satisfy metal pad density change rate according to embodiments.

FIG. 7 shows the diameter range of the intermediate metal pad that may be disposed between the region where no metal pad is formed (a region with 0% metal density) and the region where the diameter of the metal pad is 8 μm (base diameter) on metal pad pitch-metal density coordinates. If the diameter of the intermediate metal pad is about 4.77 μm to 6.42 μm, for example, voids on the bonded surface of the semiconductor layer (e.g., semiconductor wafer or semiconductor chip) may be reduced (e.g., prevented).

Figure 8:
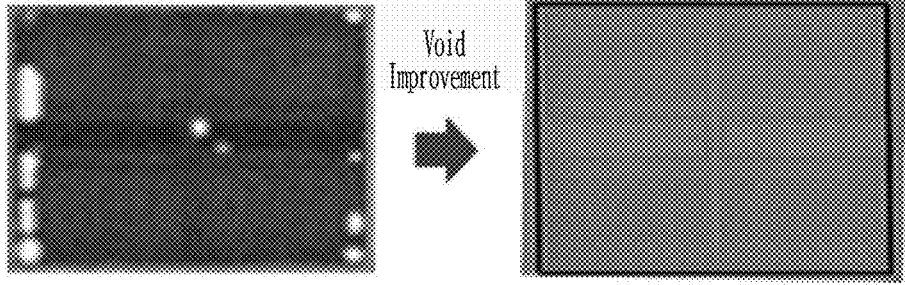
FIG. 8 shows photographs comparing an occurrence of voids after bonding for a case where a conventional metal pad arrangement method is applied and a case where a metal pad arrangement method according to embodiments is applied.

FIG. 8 shows photographs comparing an occurrence of voids after bonding for a case where a conventional metal pad arrangement method is applied and a case where a metal pad arrangement method according to embodiments is applied.

If the intermediate metal pad (with intermediate size) is not placed, as shown in the left picture of FIG. 8, voids may occur in various parts, such as the periphery and center of the semiconductor chip. However, in the case of placing the intermediate metal pad, as shown in the picture on the right of FIG. 8, voids may be reduced (e.g., prevented).

Figure 9:
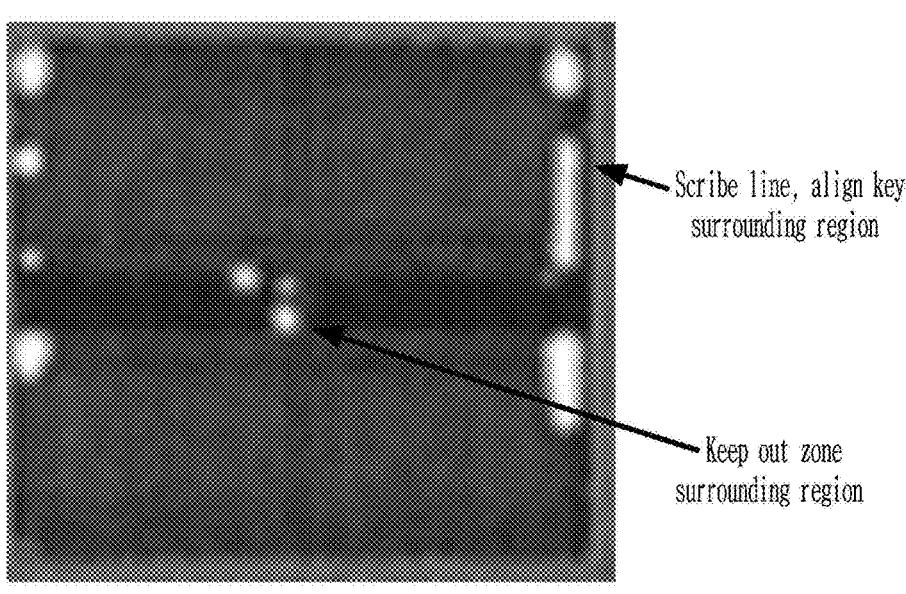
FIG. 9 provides views showing a picture of a semiconductor chip stack in which voids occur after bonding, positions in which the voids occur in a semiconductor chip stack, and a corresponding chip profile.
Figure 9:
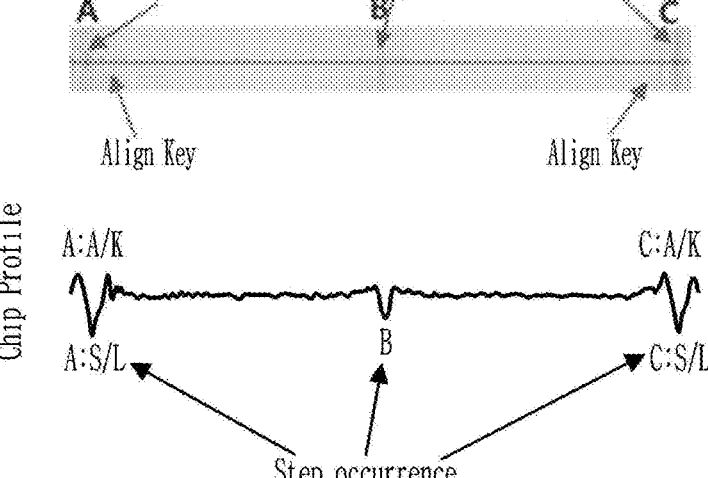

FIG. 9 provides views showing a picture of a semiconductor chip stack semiconductor device) in which voids occur after bonding, positions in which the voids occur in a semiconductor chip stack, and a corresponding chip profile.

Referring to FIG. 9, the positions where the voids occur on the stack interface (bonded surface) after the bonding may be mainly around a scribe line, around the align key, and around a keep out zone. The reason why the voids occur in these areas is that a large step difference may be formed on the bonded surface in these areas, and the large step difference may be formed due to the large difference in an erosion rate between the region where the metal pad exists and the region where the metal pad does not exist during the polishing of the damascene process to form the metal pad.

In an embodiment, by placing the intermediate metal pad (with intermediate size), the occurrence of the regions with drastic erosion rate change may be reduced (e.g., prevented), and thereby the occurrence of voids may be reduced (e.g., prevented) on the stack interface (bonded surface) accordingly.

Figure 10:
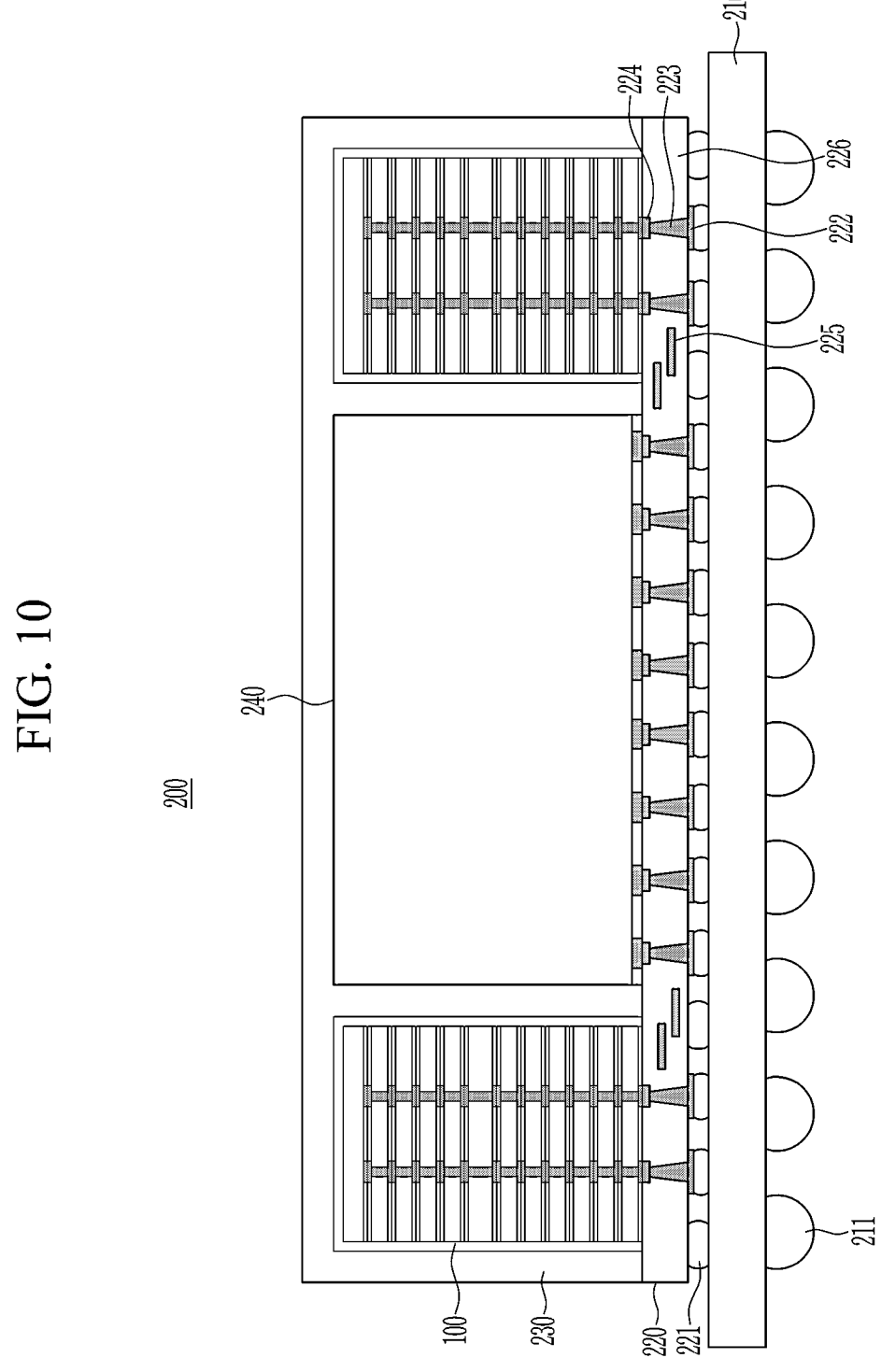
FIG. 10 is a cross-sectional view of a 2.5D semiconductor package including a high-bandwidth memory (HBM) according to embodiments.

FIG. 10 is a cross-sectional view of a 2.5D semiconductor package including a high-bandwidth memory (HBM) according to embodiments.

A 2.5D semiconductor package 200 may include a flexible printed circuit (FPC) 210, a silicon interposer 220, a high bandwidth memory (HBM; 100), a logic circuit (a semiconductor chip; 240), and an encapsulant 230.

The metal pad arrangement according to an embodiment described above may be applied to at least one of the silicon interposer 220, each layer of the high bandwidth memory 100, and the logic circuit 240.

The flexible printed circuit (FPC) 210 may be bonded to an external connection terminal 211 so that it may be electrically coupled with an external device. In an embodiment, the external connection terminal 211 may include a solder ball. In an embodiment, the external connection terminal 211 may include tin (Sn) and/or lead (Pb), but is not limited thereto.

The silicon interposer 220 may include metal vias 223, bonding pads 222 and 224, redistribution lines 225 and a silicon insulation layer 226. The metal vias 223 and the redistribution lines 225 may be connected to the bonding pads 222 and 224 to be electrically coupled. The bonding pads 222 may be connected to the connection member 221 and electrically coupled. The bonding pads 224 may be connected to the high bandwidth memory (HBM; 100) and the logic circuit 240 by the hybrid bonding and may be electrically coupled.

The connection member 221 may be bonded to the bonding pad 222 of the silicon interposer 220 to electrically couple the flexible printed circuit (FPC) 210 and the silicon interposer 220. In an embodiment, the connection member

221 may include a solder ball. In an embodiment, the connection member 221 may include tin (Sn) and/or lead (Pb), but is not limited thereto. In another embodiment, the connection member 221 may include tin (Sn), bismuth (Bi), silver (Ag), copper (Cu), and/or alloys thereof.

The high bandwidth memory (HBM) 100 may include 12H-semiconductor chip dies and an 8H-semiconductor chip die between the 12H-semiconductor chip dies. In addition, the high bandwidth memory (HBM) 100 may include 16H-semiconductor chip dies and an 8H-semiconductor chip die between the 16H-semiconductor chip dies. In addition, the high bandwidth memory (HBM) 100 may include 16H-semiconductor chip dies and a 12H-semiconductor chip die between the 16H-semiconductor chip dies.

The logic circuit 240 may be disposed side-by-side with the high bandwidth memories (HBMs) 100 between the high bandwidth memories (HBMs) 100. In an embodiment, the logic circuit 240 may include a central processing unit (CPU) and/or a graphics processing unit (GPU).

The encapsulant 230 may be disposed on (e.g., mold or enclose) the high bandwidth memories (HBMs) 100 and the logic circuit 240 on the silicon interposer 220. In an embodiment, the encapsulant 230 may include an epoxy molding compound (EMC), but is not limited thereto.

Figure 11:
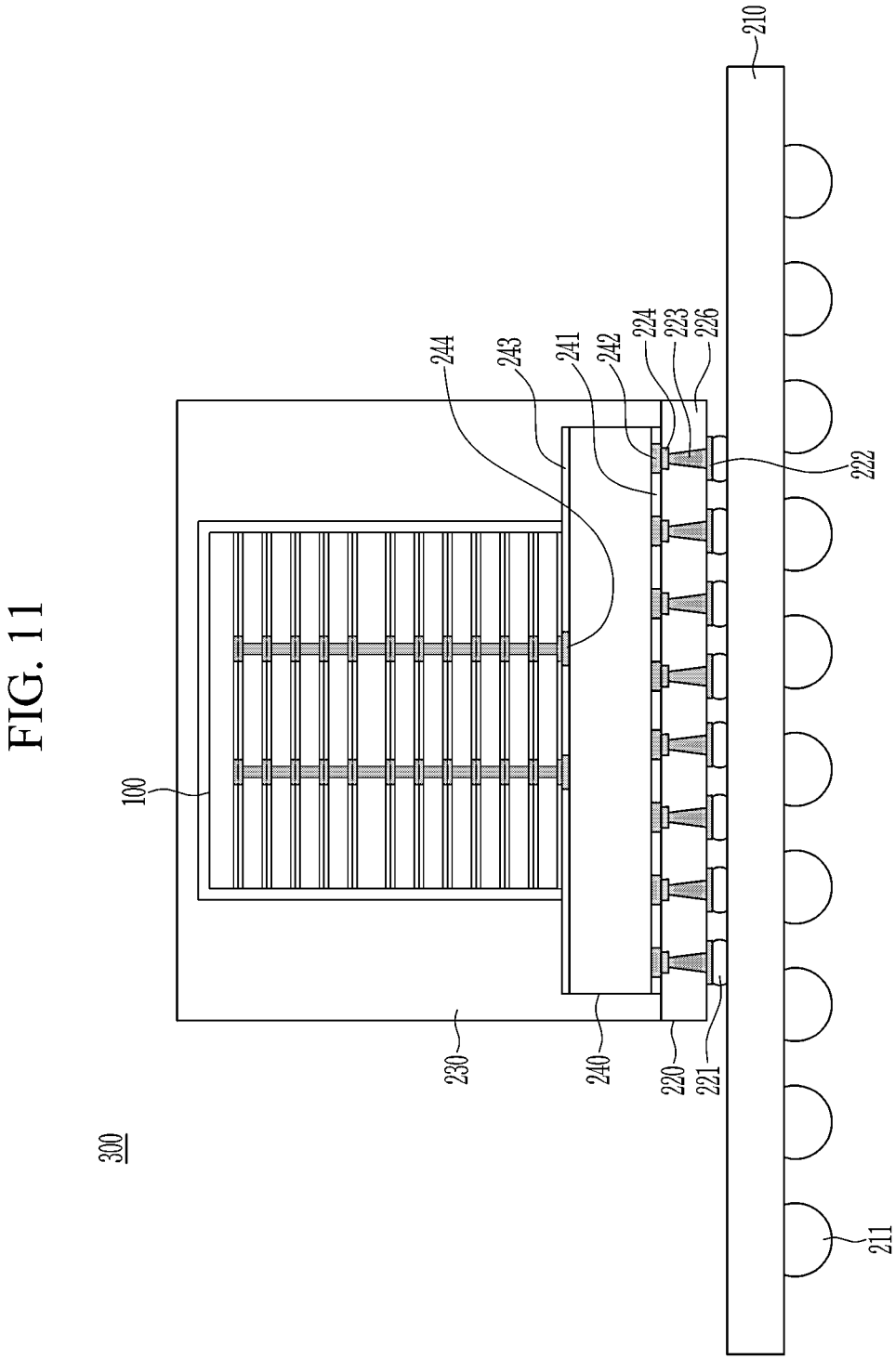
FIG. 11 is a cross-sectional view of a 3D semiconductor package including a high-bandwidth memory (HBM) according to embodiments.

FIG. 11 is a cross-sectional view of a 3D semiconductor package including a high-bandwidth memory (HBM) according to embodiments.

A 3D semiconductor package 300 of FIG. 11 may include a flexible printed circuit (FPC) 210, a silicon interposer 220, a high bandwidth memory (HBM) 100, a logic circuit 240, an encapsulant 230, an external connection terminal 211, and a connection member 221, and the silicon interposer 220 may include metal vias 223, 10) bonding pads 222 and 224 of the silicon interposer 220, and the silicon insulation layer 226, but for those configurations, the characteristics of the configurations of the 2.5D semiconductor package 200 of FIG. 10 may be equally applied. In addition, the metal pad arrangement according to the embodiment described above may be applied to at least one of the silicon interposer 220, each layer of the high bandwidth memory 100, and the logic circuit 240.

Referring to FIG. 11, the semiconductor package 300 may include the logic circuit 240 mounted on the silicon interposer 220, and the high bandwidth memory (HBM) 100 mounted on the logic circuit 240. In the embodiment of FIG. 10, while the logic circuit 240 is disposed side-by-side with the high bandwidth memories (HBMs) 100 on the silicon interposer 220, in FIG. 11, the silicon interposer 220, the logic circuit 240 and the high bandwidth memory (HBM) 100 may be disposed vertically. At this time, the silicon interposer 220, the logic circuit 240 and the high bandwidth memory (HBM) 100) may be connected (e.g., electrically coupled) to each other by the hybrid bonding. A silicon insulation layer 241 of the logic circuit 240 may be connected to the silicon insulation layer 226 of the silicon interposer 220 by the hybrid bonding and electrically coupled. Bonding pads 242 of the logic circuit 240 may be connected to the bonding pads 224 of the silicon interposer 220 through the hybrid bonding and electrically coupled. A silicon insulation layer 243 of the logic circuit 240 may be connected to silicon insulation layers and of semiconductor chip dies of the high bandwidth memory (HBM) 100 by the hybrid bonding, and electrically coupled. Bonding pads 244 of the logic circuit 240 may be connected to the bonding pads of the semiconductor chip dies of the high bandwidth memory (HBM) 100 by the hybrid bonding, and electrically coupled.

While this invention has been described in connection with what is presently considered to be practical embodiments, it is to be understood that the invention is not limited to the disclosed embodiments. On the contrary, it is intended to cover various modifications and equivalent arrangements included within the scope of the appended claims.

What is claimed is:

1. A semiconductor device comprising:
a semiconductor layer, including a wire and an electrical element; and
a plurality of metal pads on a surface of the semiconductor layer,
wherein the plurality of metal pads includes a first metal pad and a second metal pad,
wherein the second metal pad is smaller in surface area or diameter on the surface of the semiconductor layer than the first metal pad,
wherein the second metal pad is between a first region of the surface of the semiconductor layer where the first metal pad is and a second region of the surface of the semiconductor layer where a surface metal density is zero (0),
wherein the first metal pad includes a real pad and a dummy pad,
wherein the real pad is electrically connected to the wire or the electrical element, and
wherein the dummy pad is not electrically connected to the wire or the electrical element.

2. The semiconductor device of claim 1, wherein the second metal pad is adjacent to an edge of the semiconductor layer.

3. The semiconductor device of claim 1, further comprising an align key adjacent to the first metal pad on the surface of the semiconductor layer.

4. The semiconductor device of claim 1, wherein the dummy pad is between the real pad and the second metal pad.

5. The semiconductor device of claim 4, wherein the second metal pad is between the dummy pad and the second region of the surface of the semiconductor layer.

6. The semiconductor device of claim 1, further comprising a third metal pad between the second metal pad and the second region of the surface of the semiconductor layer.

7. The semiconductor device of claim 6, wherein the third metal pad is smaller in surface area or diameter on the surface of the semiconductor layer than the second metal pad.

8. The semiconductor device of claim 1, wherein a topological change rate of the surface of the semiconductor layer is less than or equal to a permissible topology change rate expressed as:

$$\text{Permissible Topology Change Rate}[\%/\mu m]=(\text{Topology Change Reference}[\text{Å}/\mu m])/(\text{Relation between Metal Pad Density and Bonded Surface Erosion Depth}[\text{Å}/\%]).$$

9. The semiconductor device of claim 1, wherein a topological change rate of the surface of the semiconductor layer is less than or equal to a permissible topology change rate expressed as:

$$\text{Permissible Topology Change Rate}[\%/\text{pitch}]=\{(\text{Topology Change Reference}[\text{Å}/\mu m])/(\text{Relation between Metal Pad Density and Bonded Surface Erosion Depth}[\text{Å}/\%])\}*\text{Metal Pad Pitch}[\mu m].$$

10. The semiconductor device of claim 9, wherein the topological change rate of the surface of the semiconductor layer is 3.6% per four metal pad pitches or less.

11. The semiconductor device of claim 1, wherein a diameter of the second metal pad on the surface of the semiconductor layer is 59.625% to 80.25% of a diameter of the first metal pad on the surface of the semiconductor layer.

12. The semiconductor device of claim 1, wherein a diameter of the first metal pad on the surface of the semiconductor layer is 8 micrometers (μm), and a diameter of the second metal pad on the surface of the semiconductor layer is 4.77 μm to 6.42 μm.

13. A manufacturing method of a semiconductor device, the method comprising:

preparing a first semiconductor layer including a wire and an electrical element, wherein a plurality of metal pads is on a surface of the first semiconductor layer; and stacking and bonding a second semiconductor layer on the surface of the first semiconductor layer, wherein the plurality of metal pads includes a first metal pad and a second metal pad, wherein the second metal pad is smaller in surface area or diameter on the surface of the first semiconductor layer than the first metal pad, wherein the second metal pad is between a first region of the surface of the first semiconductor layer where the first metal pad is and a second region of the surface of the first semiconductor layer where a surface metal density is zero (0), and wherein a topological change rate of the surface of the first semiconductor layer is less than or equal to a permissible topology change rate expressed as:

Permissible Topology Change Rate [%/μm]=(Topology Change Reference [Å/μm])/(Relation between Metal Pad Density and Bonded Surface Erosion Depth [Å/%]); or Permissible Topology Change Rate [%/pitch]={(Topology Change Reference [Å/μm])/(Relation between Metal Pad Density and Bonded Surface Erosion Depth [Å/%])}*Metal Pad Pitch [μm].

14. The manufacturing method of claim 13, wherein the bonding is a hybrid bonding, and wherein the hybrid bonding directly connects the first semiconductor layer and the second semiconductor layer.

15. The manufacturing method of claim 13, wherein the second metal pad is adjacent to an edge of the first semiconductor layer.

16. The manufacturing method of claim 13, wherein at least one of the first metal pad or the second metal pad includes a real pad and/or a dummy pad, wherein the real pad is electrically connected to the wire or the electrical element, and wherein the dummy pad is not electrically connected to the wire or the electrical element.

17. The manufacturing method of claim 13, wherein a diameter of the second metal pad on the surface of the first semiconductor layer is 59.625% to 80.25% of a diameter of the first metal pad on the surface of the first semiconductor layer.

18. A semiconductor device comprising:

a silicon interposer;

a memory that includes a plurality of semiconductor chip dies stacked on the silicon interposer; and a logic circuit on the silicon interposer, wherein the logic circuit includes a central processing unit or a graphics processing unit, wherein at least one of the silicon interposer, the plurality of semiconductor chip dies, or the logic circuit includes a plurality of metal pads on a surface thereof, wherein the plurality of metal pads includes a first metal pad and a second metal pad, wherein the second metal pad is smaller in surface area or diameter on the surface than the first metal pad, wherein the second metal pad is between a first region of the surface where the first metal pad is and a second region of the surface where a surface metal density is zero (0), and wherein the semiconductor device further comprises an align key adjacent to the first metal pad on the surface of the at least one of the silicon interposer, the plurality of semiconductor chip dies, or the logic circuit.

19. The semiconductor device of claim 18, wherein the semiconductor device is a 2.5D semiconductor package or a 3D semiconductor package.

20. The manufacturing method of claim 13, wherein an align key is adjacent to the first metal pad on the surface of the first semiconductor layer.

* * * * *